(12) United States Patent
Keller (10) Patent No.: US 8,071,441 B2
(45) Date of Patent: Dec. 6, 2011

(54) METHODS OF FORMING DRAM ARRAYS

(75) Inventor: David J. Keller, Boise, ID (US)

(73) Assignee: Micron Technology, Inc, Boise, ID (US)

( * ) Notice: Subject to any disclaimer, the term of this patent is extended or adjusted under 35 U.S.C. 154(b) by 0 days.

(21) Appl. No.: 12/031,015

(22) Filed: Feb. 14, 2008

(65) Prior Publication Data
US 2009/0209072 A1 Aug. 20, 2009

(51) Int. Cl.
*H01L 21/8242* (2006.01)
(52) U.S. Cl. ........ 438/253; 438/241; 438/592; 438/595; 438/700; 438/652
(58) Field of Classification Search .................. None
See application file for complete search history.

(56) References Cited

U.S. PATENT DOCUMENTS

| | | | | |
|---|---|---|---|---|
| 4,915,777 A | * | 4/1990 | Jucha et al. | 438/711 |
| 5,925,918 A | * | 7/1999 | Wu et al. | 257/413 |
| 5,998,290 A | * | 12/1999 | Wu et al. | 438/595 |
| 6,075,274 A | * | 6/2000 | Wu et al. | 257/413 |
| 6,197,693 B1 | | 3/2001 | Kim et al. | |
| 6,211,568 B1 | | 4/2001 | Hong | |
| 6,326,260 B1 | * | 12/2001 | Divakaruni et al. | 438/241 |
| 6,514,842 B1 | * | 2/2003 | Prall et al. | 438/593 |
| 6,521,963 B1 | | 2/2003 | Ota et al. | |
| 7,015,151 B2 | * | 3/2006 | Powell | 438/770 |
| 7,029,999 B2 | | 4/2006 | Lim et al. | |
| 7,030,012 B2 | * | 4/2006 | Divakaruni et al. | 438/652 |
| 7,279,413 B2 | | 10/2007 | Park et al. | |
| 7,288,817 B2 | | 10/2007 | Juengling et al. | |
| 2005/0026443 A1 | * | 2/2005 | Goo et al. | 438/694 |
| 2005/0227378 A1 | * | 10/2005 | Moise et al. | 438/3 |
| 2006/0186449 A1 | | 8/2006 | Uchiyama | |
| 2007/0037352 A1 | | 2/2007 | Suzawa et al. | |
| 2009/0209072 A1 | * | 8/2009 | Keller | 438/253 |

OTHER PUBLICATIONS

Wolf et al. (Silicon Processing for the VLSI Era, vol. 1: Process Technology. 2nd Ed. Sunset Beach: Lattice Press, 2000. 202-206).*

* cited by examiner

*Primary Examiner* — Ha Tran T Nguyen
*Assistant Examiner* — Shantanu C Pathak
(74) *Attorney, Agent, or Firm* — Wells St. John P.S.

(57) ABSTRACT

Some embodiments include methods of forming transistor gates. A gate stack is placed within a reaction chamber and subjected to at least two etches, and to one or more depositions to form a transistor gate. The transistor gate may comprise at least one electrically conductive layer over a semiconductor material-containing layer. At least one of the one or more depositions may form protective material. The protective material may extend entirely across the at least one electrically conductive layer, and only partially across the semiconductor material-containing layer to leave unlined portions of the semiconductor material-containing layer. The unlined portions of the semiconductor material-containing layer may be subsequently oxidized.

15 Claims, 7 Drawing Sheets

METHODS OF FORMING DRAM ARRAYS

TECHNICAL FIELD

Methods of forming transistor gates, methods of forming memory cells, and methods of forming DRAM arrays.

BACKGROUND

Fabrication of integrated circuitry may comprise formation of transistors on a semiconductor substrate. The transistors may be used in logic or memory. For instance, if the transistors are utilized in memory they may be utilized to form memory cells, such as memory cells of a dynamic random access memory (DRAM) array.

Continuing goals of integrated circuit fabrication are to increase throughput, reduce process steps, and reduce costs. Transistor fabrication comprises numerous steps, each of which slows throughput and carries risk of error. It would be desirable to develop methods for transistor fabrication which reduce the number of process steps relative to conventional methods.

DETAILED DESCRIPTION OF THE ILLUSTRATED EMBODIMENTS

Conventional methods for fabricating transistor gates comprise forming a gate stack over a semiconductor substrate, and subsequently patterning a plurality of transistor gates from the stack. The transistor gates may comprise, in ascending order from the semiconductor substrate, gate dielectric material, conductively-doped semiconductor material, one or more electrically conductive metal-containing layers, and an electrically insulative capping layer.

The transistor gates will have sidewalls extending along the conductively-doped semiconductor material, electrically conductive metal-containing layers, and the electrically insulative capping layer.

There may be advantages to oxidizing the conductively-doped semiconductor material along sidewalls. However, if such oxidation is conducted while the metal-containing layers are exposed along the sidewalls, problems can occur due to oxidation of the exposed regions of the metal-containing layers. Accordingly, methods have been developed for depositing protective material along the portions of the sidewalls that comprise the metal-containing layers prior to oxidation of the conductively-doped semiconductor material along the sidewalls.

The deposition of the protective material occurs in a separate reaction chamber from that utilized for etching through the gate stacks, because reaction chambers suitable for etching are often designed to work at lower temperatures than the temperature regimes suitable for deposition of the protective material.

Some embodiments include methods in which the reactants utilized for depositing protective material are chosen to be suitable for forming the protective material at the low temperatures achievable in the reaction chamber utilized for etching. Accordingly, the deposition and etching may be conducted in the same reaction chamber as one another, which can eliminate a conventional process step of transferring a substrate from one reaction chamber utilized during etching to another reaction chamber utilized during deposition. Elimination of such process step may improve throughput, and may avoid costs associated with errors that occur during transferring of a substrate between chambers.

Example embodiments are described with reference to FIGS. 1-13.

Figure 1:
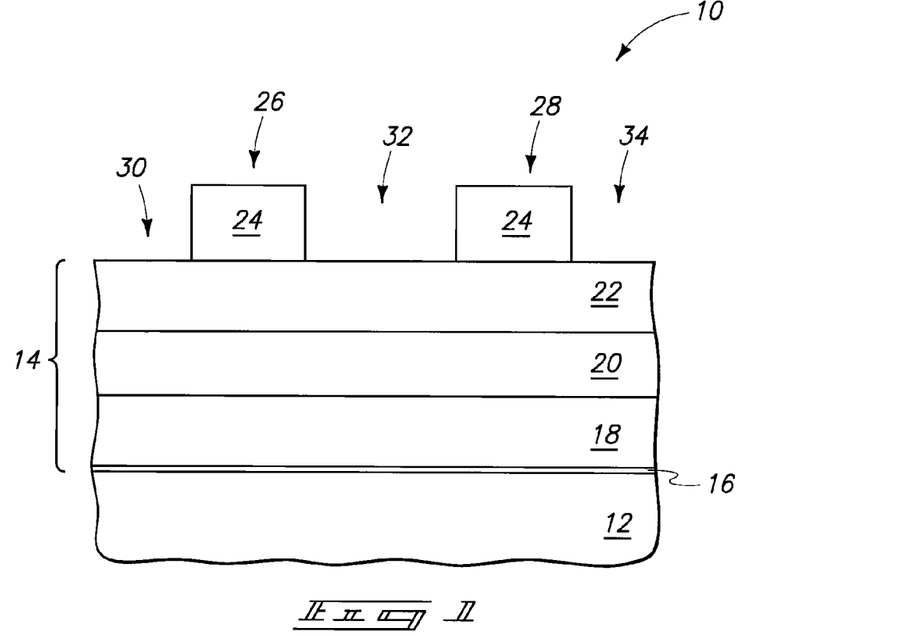
FIGS. 1-8 are diagrammatic, cross-sectional views of a portion of a semiconductor construction at various stages of an example embodiment process for fabrication of transistors.

Referring to FIG. 1, a semiconductor construction 10 is illustrated at a process stage. The construction 10 has a gate stack 14 formed thereover.

Semiconductor substrate 12 may comprise one or more of various semiconductor materials, such as silicon and germanium. Substrate 12 can, for example, comprise, consist essentially of, or consist of monocrystalline silicon lightly-doped with background p-type dopant. To aid in interpretation of the claims that follow, the terms "semiconductive substrate", "semiconductor construction", and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Gate stack 14 comprises, in ascending order from the substrate, a gate dielectric layer 16, a semiconductor material-containing layer 18, electrically conductive material 20, and electrically insulative capping material 22.

Gate dielectric layer 16 may comprise any suitable composition, and may, for example, comprise, consist essentially of, or consist of silicon dioxide.

Semiconductor material-containing layer 18 may comprise any suitable composition, and may, for example, comprise one or both of silicon and germanium. The semiconductor material-containing layer may be conductively doped with either n-type dopant or p-type dopant.

Electrically conductive material 20 may comprise one or more electrically conductive layers, and in some embodiments may comprise one or more metal-containing layers. The metal-containing layers may contain metal in elemental form (for instance, tungsten, titanium, etc.) and/or may contain metal as part of a composition (for instance, metal nitride, metal silicide, etc.). For instance, conductive material 20 may comprise, in ascending order from layer 18, a layer of tungsten, a layer of tungsten nitride, and a layer of titanium.

Electrically insulative capping layer 22 may comprise any suitable composition, and in some embodiments may comprise, consist essentially of, or consist of silicon nitride.

A patterned masking material 24 is over insulative material 22. Masking material 24 may comprise any suitable composition or combination of compositions. In some embodiments, masking material 24 may be carbon (for instance transparent carbon) patterned utilizing a photolithographically-formed photoresist mask (not shown). Masking material 24 defines a pair of projections 26 and 28. Gaps 30, 32 and 34 are adjacent such projections.

Figure 2:
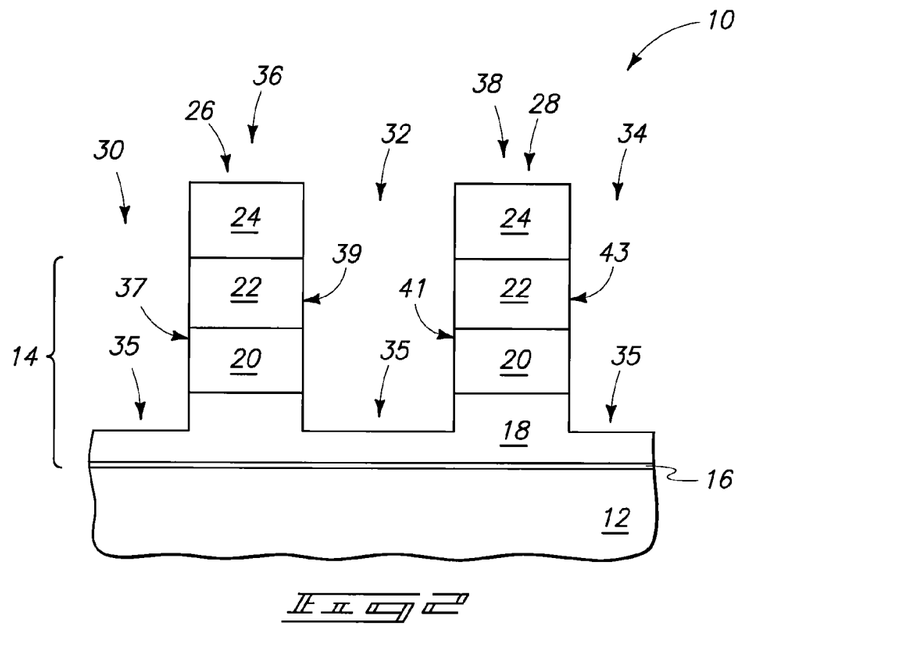

Referring to FIG. 2, etching is conducted to extend gaps 30, 32 and 34 into stack 14 to partially form a pair of transistor gates 36 and 38. The etch goes through layer 22, through material 20 and partially into layer 18. The etching may comprise multiple different etches to progress through the multiple different components of the gate stack. For instance, the etch may utilize $CF_4/CH_2F_2/O_2$ to pass through a silicon-nitride containing layer 22; $NF_3/Cl_2$ to pass through a tungsten-containing portion of conductive material 20; and $Cl_2/CF_4$ to pass through a titanium-containing portion of conductive material 20 and partially into the semiconductor material-containing layer 18.

The partially formed transistor gate 36 has opposing sidewalls 37 and 39, and the partially formed gate 38 has opposing sidewalls 41 and 43. The opposing sidewalls of the gates have regions extending along insulative layer 22 and conductive material 20, and have a region that extends along a portion of semiconductor material-containing layer 18.

The etching partially through semiconductor material 18 may be considered to leave an unetched remaining portion of the semiconductor material 18 extending between partially-formed gates 36 and 38 (with such unetched remaining portion being indicated with the label 35 in FIG. 2).

The etching utilized to form the structure of FIG. 2 may be conducted with any suitable conditions in any suitable reaction chamber. In some embodiments, the etching may be conducted in a reaction chamber comprising a plasma, and comprising a bias of from about 100 watts to about 300 watts on the substrate during the etching (with such bias imparting a potential on the substrate relative to the plasma to draw plasma components toward the substrate).

Figure 9:
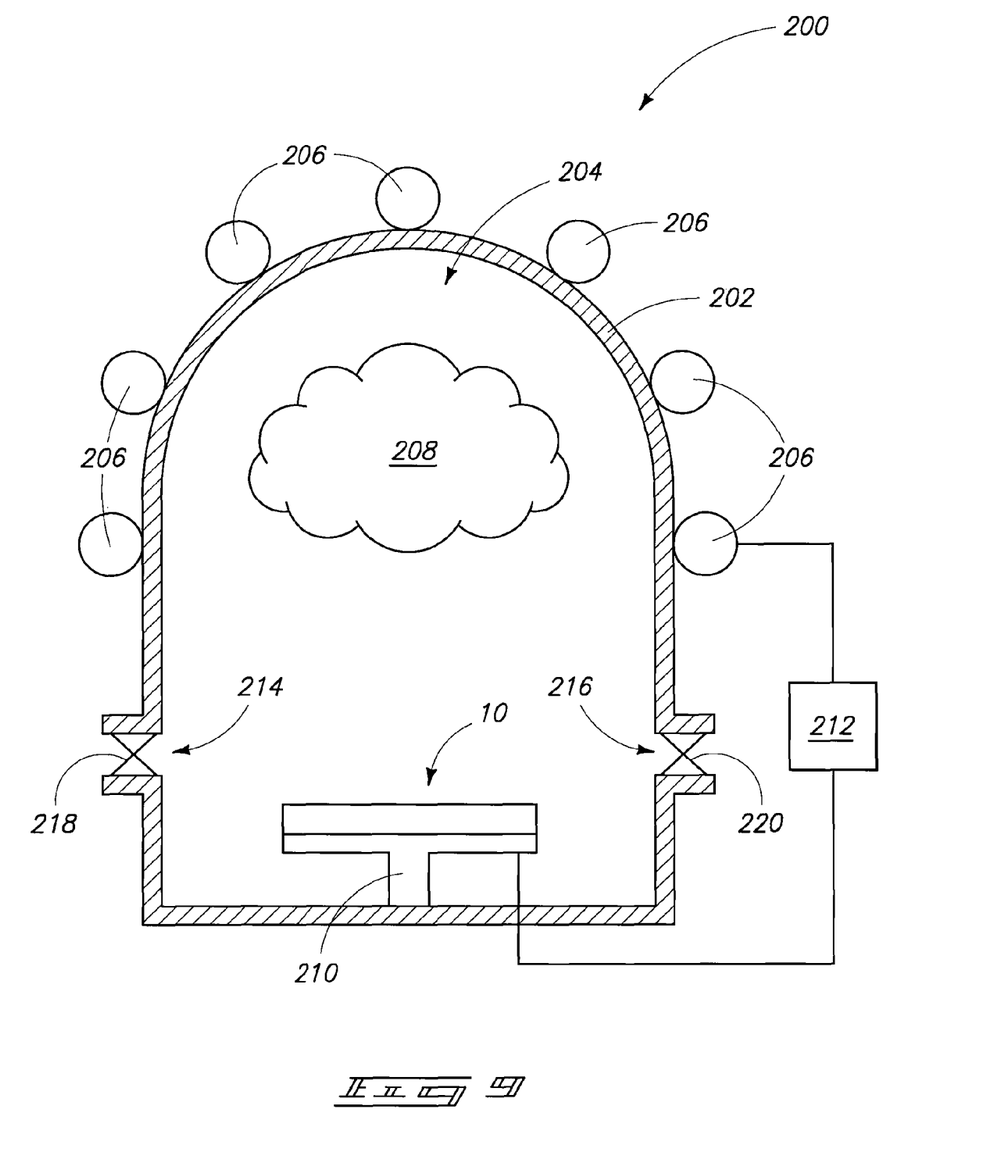
FIG. 9 is a diagrammatic, cross-sectional view of an apparatus that may be utilized in an example embodiment.

An example apparatus that may be utilized for the etching is shown in FIG. 9 as apparatus 200. The apparatus comprises a sidewall 202 surrounding a reaction chamber 204. A plurality of coils 206 are diagrammatically illustrated extending around a top portion of the reaction chamber, and such may be utilized to strike and maintain a plasma 208 within the chamber.

A substrate holder (or chuck) 210 is within the chamber, and such supports a semiconductor substrate 10. The chuck 210 and coils 206 are shown electrically connected to circuitry 212 which may be utilized to maintain the plasma and maintain desired bias on the substrate (the circuitry is specifically shown connected to one of the coils, but will be connected to all of the coils).

A pair of openings 214 and 216 extend through sidewall 202. Such openings may correspond to inlets and outlets through which precursors and/or purge gases are flowed into the reaction chamber, and through which reaction byproducts are flowed out of the reaction chamber. Valves 218 and 220 are shown extending across the openings 214 and 216, respectively. Such valves may be utilized to control flow of materials into and out of the reaction chamber, and in combination with a pump may be used to achieve desired pressure within the chamber.

One or more heating elements (not shown) may be associated with sidewall 202 to maintain desired temperature within apparatus 200.

Once a substrate is placed within reaction chamber 204, a vacuum may be created within the chamber (in other words, the pressure within the chamber may be reduced to below atmosphere pressure). Such vacuum may correspond to a pressure of less than or equal about 10 millitorr within the chamber. In some embodiments, the vacuum is created prior to the etching of FIG. 2, and maintained throughout several subsequent steps, as will be discussed in more detail below.

Figure 3:
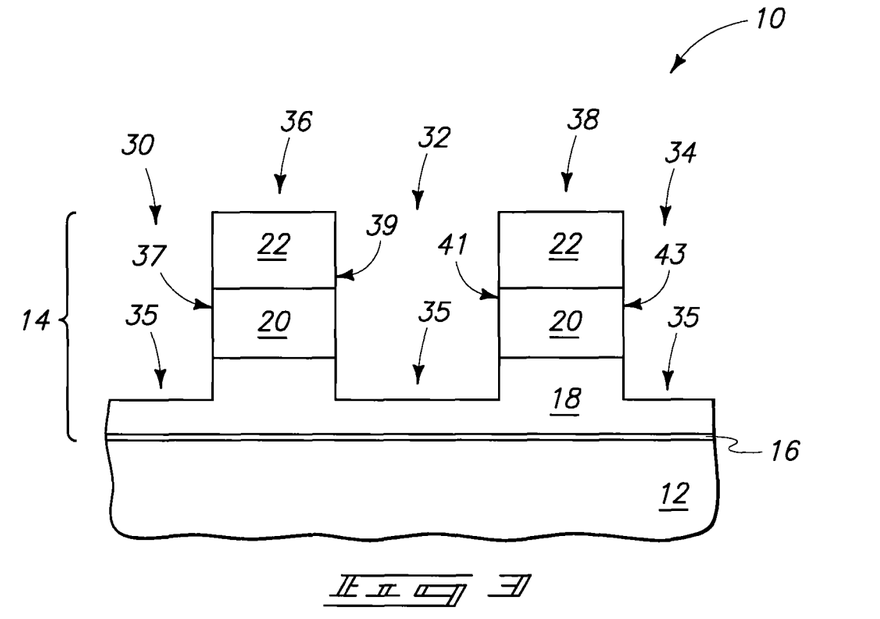

Referring to FIG. 3, masking material 24 (FIG. 2) is removed. Such removal may occur within the same reaction chamber utilized for the etching of FIG. 2, and without breaking vacuum to the chamber. Example conditions that may be utilized for removing masking material 24 include utilization of $O_2$ with top power only (i.e., power to the plasma, but no bias power) when the masking material comprises transparent carbon.

Figure 4:
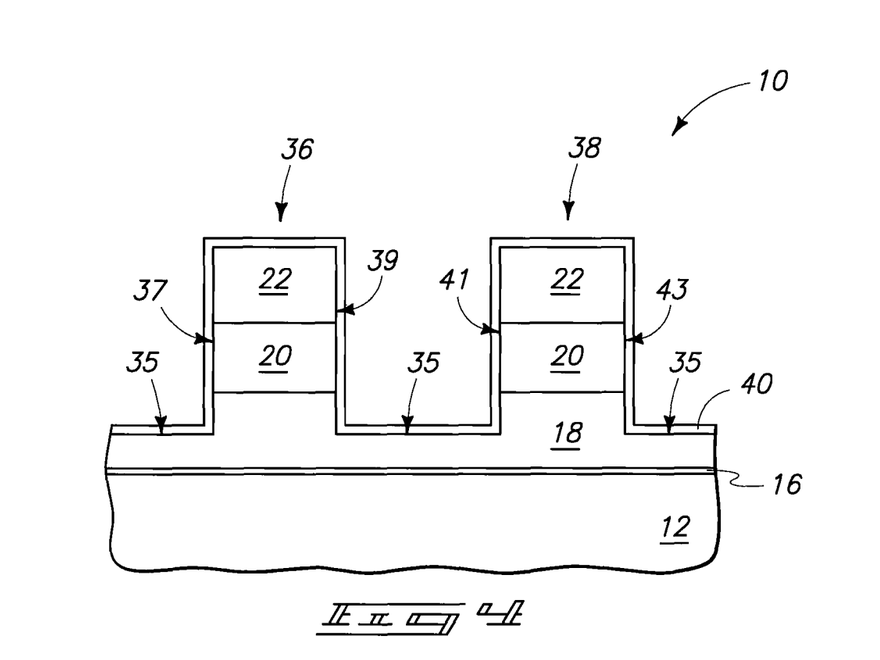

Referring to FIG. 4, electrically insulative protective material 40 is deposited across partially-formed transistor gates 36 and 38, as well as across the portions 35 of semiconductor material-containing layer 18. The protective material 40 extends along the opposing sidewalls 37 and 39 of partially have been formed gate 36, as well as along the opposing sidewalls 41 and 43 of partially-formed gate 38, and extends along the top surface of capping layer 22 of the partially-formed gates 36 and 38.

Protective material 40 may comprise, consist essentially of, or consist of one or both of silicon nitride and silicon dioxide. The deposition of protective material 40 may be conducted in the same reaction chamber utilized for the steps of FIGS. 2 and 3, and without breaking vacuum to the chamber. Specifically, deposition conditions are chosen which may be conducted at the relatively low temperatures attainable in a reaction chamber configured for etching. Such deposition conditions may comprise utilization of silicon tetrachloride ($SiCl_4$) as a silicon-containing reactant, as opposed to the silane ($SiH_4$) conventionally utilized to form protective material analogous to material 40.

If protective material 40 comprises, consists essentially of, or consists of silicon dioxide, such material may be formed from $SiCl_4$ in combination with any suitable oxygen-containing reactant, such as $O_2$. The $SiCl_4$ may be flowed into the reaction chamber at a rate of about 50 standard cubic centimeters per minute (sccm), and the $O_2$ may be flowed into the reaction chamber at a rate of about 100 sccm. Power to the plasma may be about 1300 watts, and the bias on the substrate may be about 0 watts (and in some embodiments may be exactly 0 watts). The silicon dioxide may be formed at a temperature of less than 100° C. (for instance, a temperature of about 70° C.). The silicon tetrachloride and oxygen may be flowed into the chamber for a time of from about three seconds to about 20 seconds (for instance, for time of about seven seconds) to form protective material 40 to a thickness of from about 50 angstroms to about 150 angstroms (for instance, to a thickness of about 80 angstroms).

If protective material 40 comprises, consists essentially of, or consists of silicon nitride, such material may be formed from $SiCl_4$ in combination with any suitable nitrogen-containing reactant, such as $N_2$. The $SiCl_4$ may be flowed into the reaction chamber at a rate of about 50 standard cubic centimeters per minute (sccm), and the $N_2$ may be flowed into the reaction chamber at a rate of about 100 sccm. Power to the plasma may be about 1300 watts, and the bias on the substrate may be about 0 watts (and in some embodiments may be exactly 0 watts). The silicon nitride may be formed at a temperature of less than 100° C. (for instance, a temperature of about 70° C.). The silicon tetrachloride and nitrogen may be flowed into the chamber for a time of from about three seconds to about 20 seconds (for instance, for time of about seven seconds) to form protective material 40 to a thickness of from about 50 angstroms to about 150 angstroms (for instance, to a thickness of about 80 angstroms).

Figure 5:
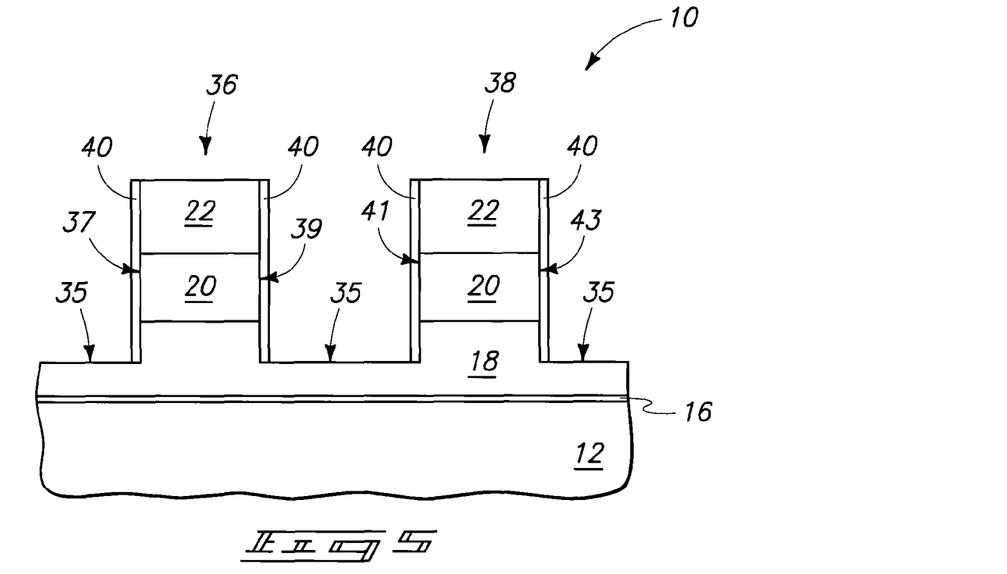

Referring to FIG. 5, protective material 40 is anisotropically etched to leave the material 40 remaining only as liners along the sidewalls 37, 39, 41 and 43 of partially-formed transistor gates 36 and 38. The anisotropic etching may be conducted in the same reaction chamber utilized for the steps of FIGS. 2-4, and without breaking vacuum to such chamber. Example conditions that may be utilized for anisotropically etching material 40 include utilization of $CF_4$ with helium carrier gas, and utilization of both top power and bias power, when the material comprises silicon dioxide or silicon nitride.

Figure 6:
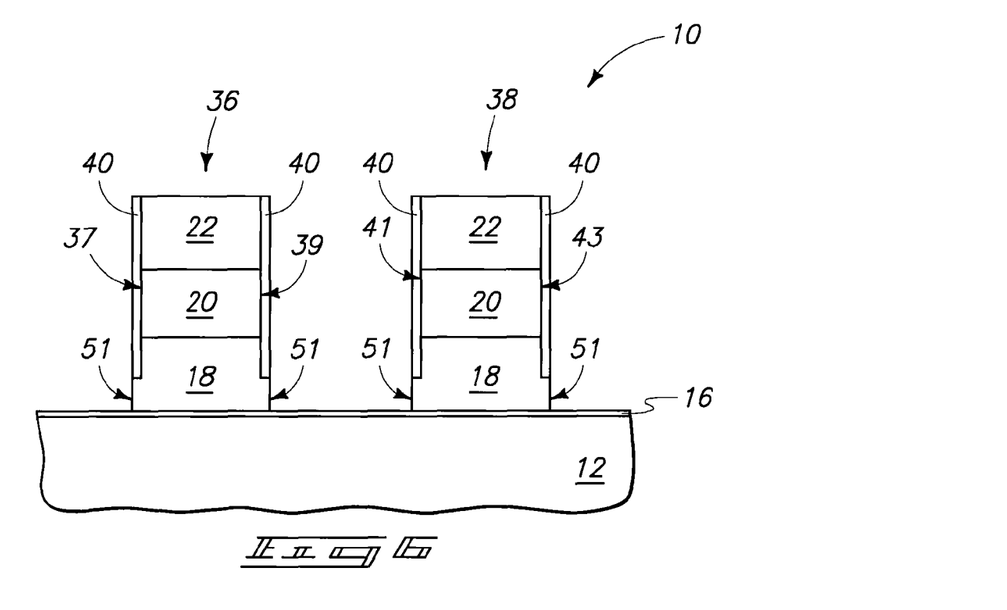

Referring to FIG. 6, an etch is conducted to punch through the remaining portion of semiconductor material-containing layer 18 (FIG. 5) to complete patterning of transistor gates 36 and 38. Such etch may be selective for material of layer 18 relative to the material of gate dielectric 16. For instance, if layer 18 consists of conductively-doped silicon and layer 16 consists of silicon dioxide, the punch-through etch may utilize hydrogen bromide (HBr) and $O_2$. The punch-through etch may be conducted in the same reaction chamber utilized for the steps of FIGS. 2-5, and without breaking vacuum to such chamber.

The punch-through etch of layer 18 leaves exposed segments 51 of layer 18 along the sidewalls of gates 36 and 38. The layer 18 may be considered to have a partially-lined sidewall at the processing stage of FIG. 6. Specifically, parts of the sidewalls of layer 18 are covered by liners 40, and part of the sidewalls (corresponding to exposed segments 51) are unlined. The unlined parts of the sidewalls may be considered to correspond to unlined portions of the semiconductor material-containing layer 18.

FIGS. 1-6 illustrate a reaction sequence which may occur within a single reaction chamber, and without breaking vacuum to such chamber, which comprises at least two etches (with example etches occurring in the steps of FIGS. 2, 5 and 6 of the shown sequence) and which comprises at least one deposition (with an example deposition occurring at the step of FIG. 4 of the shown sequence).

Figure 7:
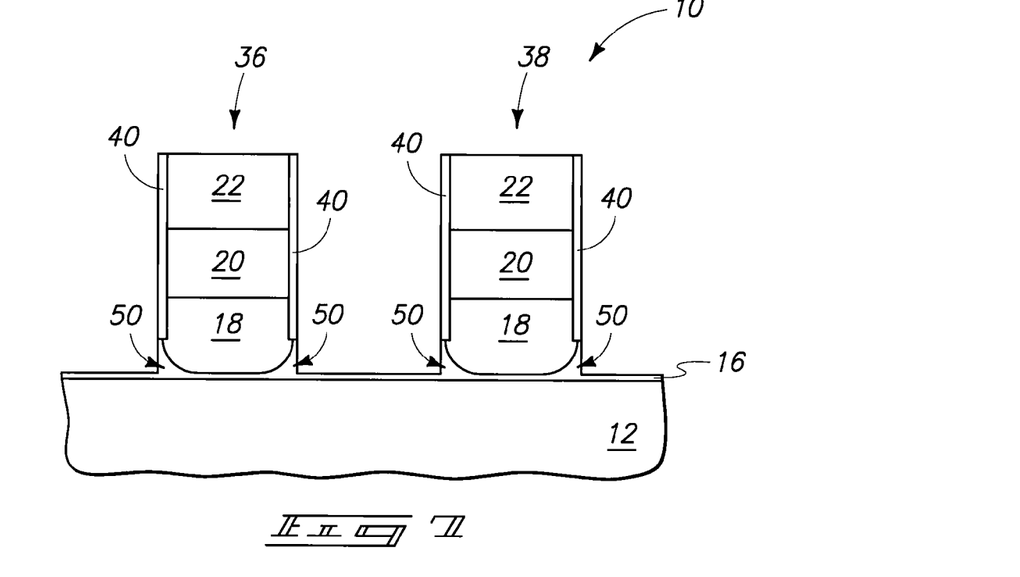

Referring to FIG. 7, the unlined portions of semiconductor material-containing layer 18 are oxidized (in other words, semiconductor material of the semiconductor material-containing layer is oxidized) to form oxide 50 along the sidewalls of semiconductor material-containing layer 18. Such oxidation may occur in the same reaction chamber utilized for the steps of FIGS. 1-6, or may occur in a different reaction chamber. The oxidation may correspond to a process known in the art as a "smiling gate" oxidation. The protective material 40 protects metals within conductive material 20 from being exposed to the oxidative conditions utilized to form oxide 50 along the sidewall of semiconductor material-containing layer 18.

The oxide 50 may comprise a common composition as gate dielectric 16, and in the shown embodiment is shown merging with gate dielectric 16. For instance, if semiconductor material-containing layer 18 comprises silicon, oxide 50 may comprise silicon dioxide, and accordingly may have a common composition as a gate dielectric 16 that also comprises silicon dioxide.

Figure 8:
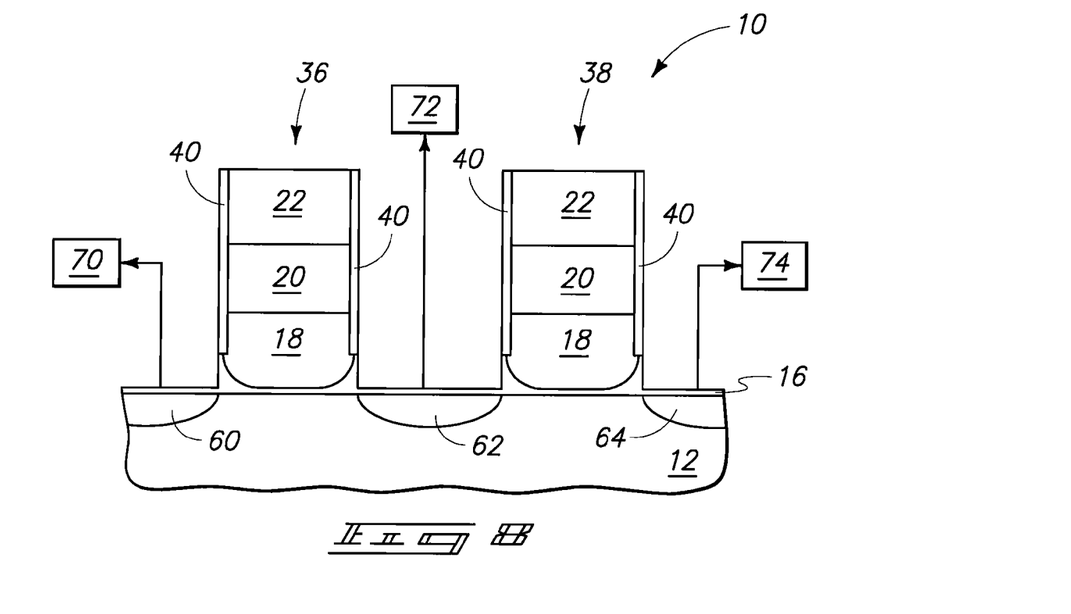

Referring to FIG. 8, source/drain regions 60, 62 and 64 are formed within semiconductor substrate 12 along the sidewalls of gates 36 and 38. The source/drain regions may comprise one or both of n-type dopant and p-type dopant.

The source/drain regions 60, 62 and 64 are shown to be electrically connected with circuit devices 70, 72 and 74, respectively. In some embodiments, circuit devices 70 and 74 may correspond to capacitors or other charge-storage devices, and circuit device 72 may correspond to a bitline. Further, the transistor gates may be comprised by wordlines that extend into and out of the page relative to the shown cross-section of FIG. 8. The combination of a transistor and a charge-storage device may be considered to form a memory cell, and specifically to form a DRAM unit cell. Accordingly, the construction of FIG. 8 may be considered to comprise a pair of DRAM unit cells sharing a common bitline (specifically, each of the transistor gates 36 and 38 gatedly couples the bitline with one of the capacitors 70 and 74). Such pair of DRAM unit cells may be representative of a large array of DRAM cells simultaneously formed across a semiconductor substrate.

The memory cells of FIG. 8 may be utilized in any of numerous electronic systems, including, for example, automobiles, clocks, telephones, computers and airplanes.

Figure 10:
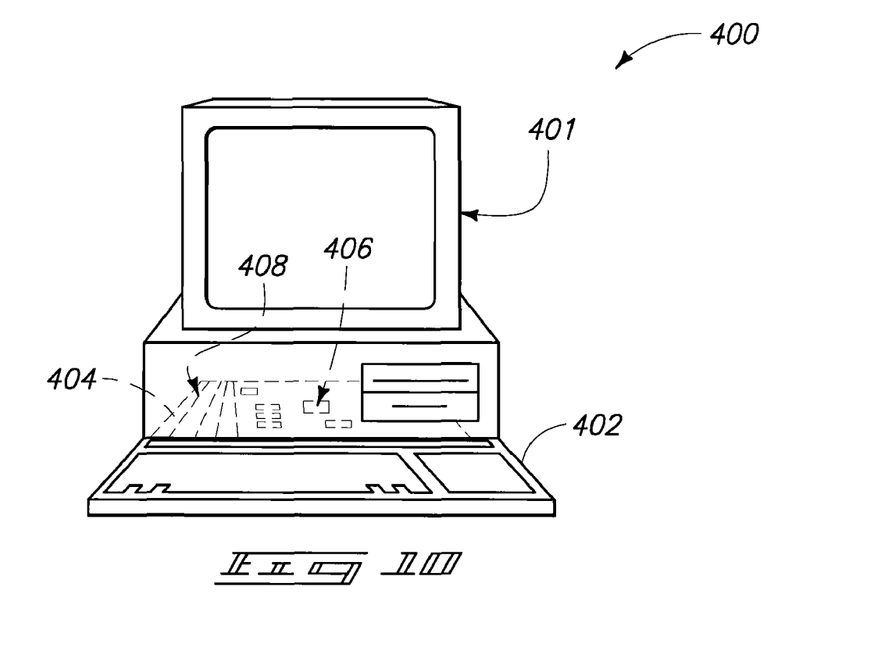
FIG. 10 is a diagrammatic view of a computer embodiment.

FIG. 10 illustrates an embodiment of a computer system 400. Computer system 400 includes a monitor 401 or other communication output device, a keyboard 402 or other communication input device, and a motherboard 404. Motherboard 404 may carry a microprocessor 406 or other data processing unit, and at least one memory device 408. Memory device 408 may comprise an array of memory cells, and such array may be coupled with addressing circuitry for accessing individual memory cells in the array. Further, the memory cell array may be coupled to a read circuit for reading data from the memory cells. The addressing and read circuitry may be utilized for conveying information between memory device 408 and processor 406. Such is illustrated in the block diagram of the motherboard 404 shown in FIG. 11. In such block diagram, the addressing circuitry is illustrated as 410 and the read circuitry is illustrated as 412.

Figure 11:
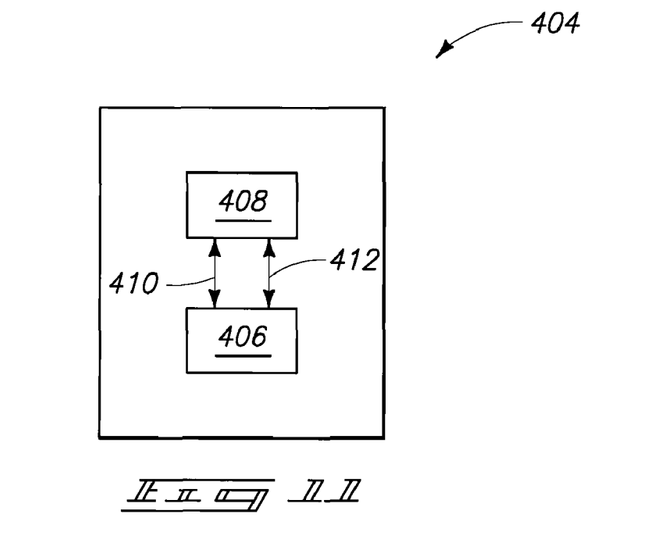
FIG. 11 is a block diagram showing particular features of the motherboard of the FIG. 10 computer embodiment.

Processor device 406 may correspond to a processor module, and associated memory utilized with the module may comprise memory cells of the type described above.

Memory device 408 may correspond to a memory module, and may comprise memory cells of the type described above.

Figure 12:
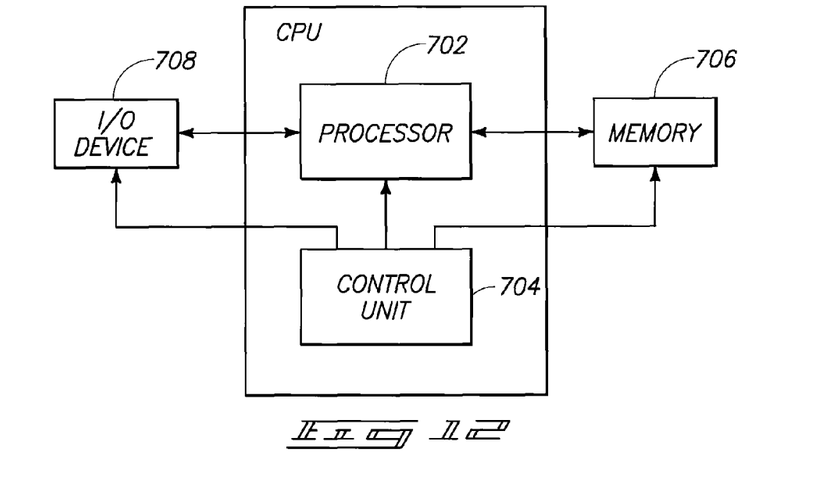
FIG. 12 is a high level block diagram of an electronic system embodiment.

FIG. 12 illustrates a simplified block diagram of a high-level organization of an electronic system 700. System 700 may correspond to, for example, a computer system, a process control system, or any other system that employs a processor and associated memory. Electronic system 700 has functional elements, including a processor 702, a control unit 704, a memory device unit 706 and an input/output (I/O) device 708 (it is to be understood that the system may have a plurality of processors, control units, memory device units and/or I/O devices in various embodiments). Generally, electronic system 700 will have a native set of instructions that specify operations to be performed on data by the processor 702 and other interactions between the processor 702, the memory device unit 706 and the I/O device 708. The control unit 704 coordinates all operations of the processor 702, the memory device 706 and the I/O device 708 by continuously cycling through a set of operations that cause instructions to be fetched from the memory device 706 and executed. The memory device 706 may include memory cells of the type described above.

Figure 13:
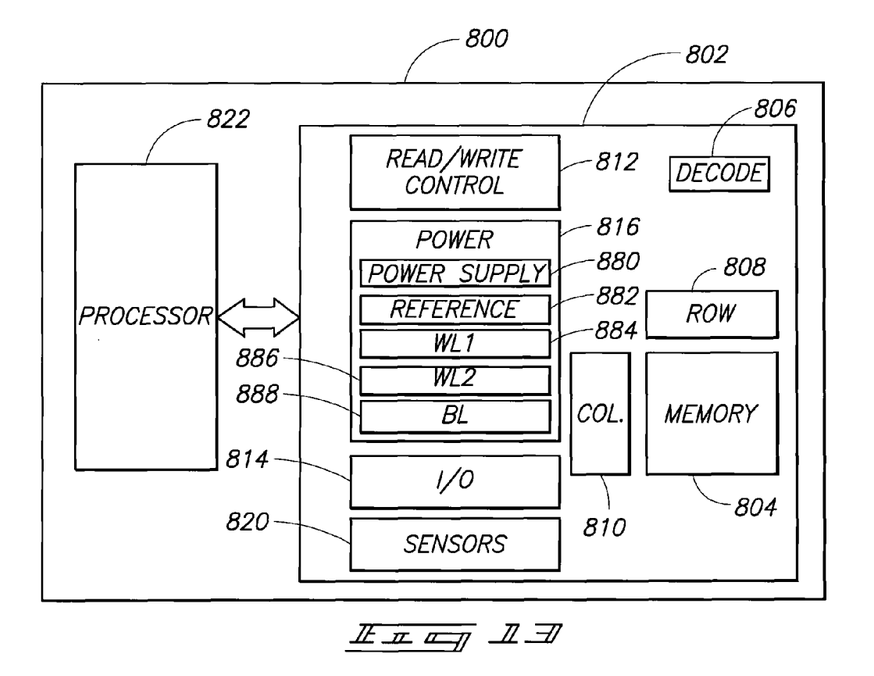
FIG. 13 is a simplified block diagram of a memory device embodiment.

FIG. 13 is a simplified block diagram of an electronic system 800. The system 800 includes a memory device 802 that has an array of memory cells 804, address decoder 806, row access circuitry 808, column access circuitry 810, read/write control circuitry 812 for controlling operations, and input/output circuitry 814. The memory device 802 further includes power circuitry 816, and sensors 820, such as current sensors for determining whether a memory cell is in a low-threshold conducting state or in a high-threshold non-conducting state. The illustrated power circuitry 816 includes power supply circuitry 880, circuitry 882 for providing a reference voltage, circuitry 884 for providing a first wordline with pulses, circuitry 886 for providing a second wordline with pulses, and circuitry 888 for providing a bitline with pulses. The system 800 also includes a processor 822, or memory controller for memory accessing.

The memory device 802 receives control signals from the processor 822 over wiring or metallization lines. The memory device 802 is used to store data which is accessed via I/O lines. At least one of the processor 822 or memory device 802 may include memory cells of the type described above.

The various electronic systems may be fabricated in single-package processing units, or even on a single semiconductor chip, in order to reduce the communication time between the processor and the memory device(s).

The electronic systems may be used in memory modules, device drivers, power modules, communication modems, processor modules, and application-specific modules, and may include multilayer, multichip modules.

The electronic systems may be any of a broad range of systems, such as clocks, televisions, cell phones, personal computers, automobiles, industrial control systems, aircraft, etc.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

I claim:

1. A method of forming a DRAM array, comprising:
   forming a gate stack over a memory array region of a semiconductor substrate; the gate stack comprising, in ascending order from the substrate, a gate dielectric layer, a semiconductor material-containing layer, and at least one electrically conductive metal-containing layer over the semiconductor material-containing layer;
   forming a patterned mask over the gate stack, the patterned mask comprising carbon;
   providing the semiconductor substrate having the gate stack and patterned mask thereon within a reaction chamber;
   while the semiconductor substrate is within the reaction chamber, etching through the at least one metal-containing layer and only partially through the semiconductor material-containing layer; the etching utilizing $Cl_2/CF_4$ during removal of the at least one metal-containing layer and penetration into the semiconductor material-containing layer; the etching forming a pair of projections comprising the semiconductor material-containing layer and the at least one metal-containing layer; individual projections having opposing sidewalls; the projections being over the memory array region of the semiconductor substrate;
   while the semiconductor substrate is within the reaction chamber, removing the patterned mask using $O_2$ and top power only within the chamber; the removal of the patterned mask exposing top surfaces of the projections;
   while the semiconductor substrate is within the reaction chamber and after removing the patterned mask, utilizing silicon tetrachloride and one or both of an oxygen-containing reactant and a nitrogen-containing reactant to form protective material along the top surfaces and along the opposing sidewalls;
   while the semiconductor substrate is within the reaction chamber, anisotropically etching the protective material to remove the protective material from the top surfaces while leaving the protective material along the opposing sidewalls; the anisotropic etching utilizing $CF_4$;
   while the semiconductor substrate is within the reaction chamber and after the anisotropic etching of the protective material, etching through a remaining portion of the semiconductor material to transform the projections into transistor gates; the etching through the remaining portion of the semiconductor material forming sidewall segments of the transistor gates; said sidewall segments having exposed semiconductor material of the semiconductor material-containing layer; the etching through the remaining portion of the semiconductor material utilizing HBr and $O_2$;
   while the semiconductor substrate is within the reaction chamber, oxidizing the exposed semiconductor material;
   forming source/drain regions within the semiconductor substrate adjacent the opposing sidewalls of the transistor gates; and
   forming capacitors in electrical contact with some of the source/drain regions and forming bitlines in electrical contact with others of the source/drain regions; the transistor gates gatedly coupling the capacitors with the bitlines; the transistor gates thus being incorporated into DRAM unit cells over the memory array region of the semiconductor substrate.

2. The method of claim 1 wherein:
   the etching through the at least one metal-containing layer utilizes plasma, and utilizes a bias on the semiconductor substrate within the chamber of from about 100 watts to about 300 watts; and
   wherein the forming the protective material utilizes a plasma, and utilizes no bias on the semiconductor substrate within the reaction chamber.

3. The method of claim 1 wherein the protective material comprises silicon dioxide.

4. The method of claim 3 wherein the protective material is formed to a thickness along the sidewalls of from about 50 Å to about 150 Å.

5. The method of claim 1 wherein the protective material comprises silicon nitride.

6. The method of claim 5 wherein the protective material is formed to a thickness along the sidewalls of from about 50 Å to about 150 Å.

7. A method of forming a DRAM array, comprising:
   forming a gate stack over a memory array region of a semiconductor substrate; the gate stack comprising, in ascending order from the substrate, a gate dielectric layer, a semiconductor material-containing layer, and at least one electrically conductive metal-containing layer;
   while the semiconductor substrate having the gate stack thereon is within a reaction chamber, subjecting the gate stack to at least two etches and one or more depositions, without removing the semiconductor substrate from the reaction chamber, to form at least one transistor gate from the gate stack; the at least two etches and one or more depositions including etching through the at least one electrically conductive metal-containing layer and only partially through the semiconductor material-containing layer, then forming protective insulative material, and then etching through a remaining portion of the semiconductor material-containing layer;
   the at least one transistor gate having a pair of opposing sidewalls extending along the semiconductor material-containing layer and the at least one electrically conductive metal-containing layer; the opposing sidewalls being partially lined with the protective insulative material formed by at least one of the one or more depositions; the protective insulative material extending entirely across the at least one electrically conductive metal-containing layer and only partially across the semiconductor material-containing layer to leave unlined portions of the semiconductor material-containing layer along the opposing sidewalls;

while the semiconductor substrate is within the reaction chamber, oxidizing the unlined portions of the semiconductor material-containing layer without oxidizing the at least one electrically conductive metal-containing layer lined with the protective insulative material;

forming source/drain regions within the semiconductor substrate adjacent the opposing sidewalls of the at least one transistor gate; and forming a capacitor in electrical contact with one of the source/drain regions and forming a bitline in electrical contact with another of the source/drain regions; the at least one transistor gate gatedly coupling the capacitor with the bitline; the at least one transistor gate thus being incorporated into a DRAM unit cell over the memory array region of the semiconductor substrate.

8. The method of claim 7 wherein:

the etching through the at least one electrically conductive metal-containing layer utilizes plasma, and utilizes a bias on the semiconductor substrate within the chamber of from about 100 watts to about 300 watts; and wherein the forming the protective material utilizes a plasma, and utilizes no bias on the semiconductor substrate within the reaction chamber.

9. The method of claim 7 wherein the protective material comprises silicon dioxide.

10. The method of claim 9 wherein the protective material is formed to a thickness along the sidewalls of from about 50 Å to about 150 Å.

11. The method of claim 7 wherein the protective material comprises silicon nitride.

12. The method of claim 11 wherein the protective material is formed to a thickness along the sidewalls of from about 50 Å to about 150 Å.

13. The method of claim 7 wherein the at least two etches and one or more depositions occur at less than atmospheric pressure within the reaction chamber without breaking vacuum within the reaction chamber from initiation of the first of the at least two etches and one or more depositions until after completion of the last of the at least two etches and one or more depositions.

14. The method of claim 13 wherein the at least two etches and one or more depositions occur at pressures of less than or equal to about 10 milliTorr.

15. The method of claim 14 wherein the at least two etches and one or more depositions occur at temperatures of less than 100° C.

* * * * *